United States Patent [19]

Ferony et al.

[11] 3,982,181

[45] Sept. 21, 1976

[54] APPARATUS AND METHOD FOR TRACING ENERGIZED AC CIRCUITS

[76] Inventors: John Thomas Ferony, 17-40 Francis Lewis Blvd., Whitestone, N.Y. 11357; Kenneth Louis Schmieder, 64-82 58 Road, Maspeth, N.Y. 11378

[22] Filed: May 21, 1975

[21] Appl. No.: 579,427

[52] U.S. Cl. .................................. 324/66; 324/67
[51] Int. Cl.² .................................... G01R 19/16
[58] Field of Search ................. 324/51, 52, 66, 67, 324/133, 119; 340/250; 179/175.3 A

[56] References Cited
UNITED STATES PATENTS

| | | | |
|---|---|---|---|
| 689,253 | 12/1901 | Varley | 324/52 |
| 1,321,543 | 11/1919 | Niswonger | 324/52 |
| 2,565,307 | 8/1951 | Harding et al. | 324/52 |
| 2,641,633 | 6/1953 | Hosford | 324/52 |
| 3,320,480 | 5/1967 | Failor | 324/51 X |
| 3,343,080 | 9/1967 | Fox | 324/52 |
| 3,621,384 | 11/1971 | Yamada | 324/52 |
| 3,810,003 | 5/1974 | Portoulas | 324/66 X |
| 3,829,765 | 8/1974 | Siler | 324/67 |
| 3,898,557 | 8/1975 | Strock | 324/51 |

*Primary Examiner*—Gerard R. Strecker
*Attorney, Agent, or Firm*—Weingarten, Maxham & Schurgin

[57] ABSTRACT

A system for use in tracing and identifying each one of a group of AC circuits in a power distribution network without necessitating removal of power from live circuits and without adverse effect on normal circuit operation. A simulated load is adapted to be coupled to any specific one of the live circuits being traced within the power network, and is operative to provide a DC current in the particular circuit in addition to the normal AC current component. A test device is adapted to be coupled sequentially to each circuit breaker or other circuit protective device normally included in each branch circuit and uniquely identifies the circuit being traced by sensing a DC voltage drop solely across the small but finite resistance of the protective device within that circuit. Means are provided to protect the sensitive DC test apparatus from damage due to inadvertant contact with the high AC voltages present in the network.

15 Claims, 5 Drawing Figures

APPARATUS AND METHOD FOR TRACING ENERGIZED AC CIRCUITS

FIELD OF THE INVENTION

This invention relates to electrical circuit tracing apparatus and more particularly to apparatus for identifying each of a group of electrical circuits in an AC power distribution network.

BACKGROUND OF THE INVENTION

It is often required to trace and identify a particular one or all of the electrical circuits within a building or other installation for purposes of repair, modification, or to determine whether additional load may be placed on the circuit. An exceedingly large number of branch circuits may exist within a particular installation, all emanating from an incoming multi-phase power source. Of course circuit identification is often no problem if adequate wiring diagrams exist, but as installations are modified, new branches added an old circuits extended, the identity of a circuit from the load back to the panel or feeder simply is unknown. Even documentation, when it does exist is frequently unreliable and experienced electrical engineers will insist that the wiring be traced at the site.

Circuit identification has traditionally been accomplished by disconnecting power from the group of circuits under investigation and tracing continuity of the particular branch by the introduction of a test signal at one end of the de-energized circuit while sensing for the test signal at the opposite end of the circuit to isolate the circuit being sought. According to one prior technique, the test signal input is an audio frequency voltage which is detected by headphones at the opposite circuit end. Each branch being identified is tested separately and since this may be a time consuming task, it is not uncommon for the power to be disconnected for considerable periods.

In many instances it is highly inconvenient and often impractical to de-energize the electric circuits under investigation. For example, in an electrical distribution system within a hospital, the removal of power will disrupt hospital operation and can be of serious consequence.

It is also undesirable to de-energize the electrical circuits in a computer center or in a continuous process installation wherein loss of power can produce ruinous results. Even in less critical electrical distribution systems such as in an office building, the shutdown of power can cause great inconvenience to tenants, and if such shutdown were to occur other than during usual working hours, as on weekends and holidays, additional expense can arise by reason of the payment of overtime wages to personnel involved. Thus, the advantages of being able to identify all circuits in a functioning installation without removal of power from such circuits is self-evident.

SUMMARY OF THE INVENTION

The present invention contemplates and has as a primary object the provision of a system for tracing and identifying AC branch circuits in a power distribution network without removal of the power and wherein the operation of all normal loads on the power system remain unaffected by the test procedure. More specifically, an apparatus providing a simulated load is connected to the outlet end of the circuit to be identified and is operative to cause a DC current to flow in that circuit where the DC is superimposed on the normal AC current flow therein. A novel test circuit is adapted to be connected sequentially across the panel circuit breakers or other circuit protective devices at the opposite end of each of the circuits in the group which includes the one under investigation, the test circuit being operative to detect any DC voltage drop across the relatively small but measurable contact resistance of the one circuit protective device carrying the DC current. The circuit being traced is thereby uniquely identified.

To provide the required DC current, the load apparatus is comprised of a load resistor and a power rectifier in series. When connected to the live AC power line, the load results in introduction of a DC current into the circuit to be identified. The load apparatus can be contained within a portable housing for convenient movement to various power outlets of the different circuits being traced. The test circuit includes a pair of test probes, a sensitive center-position DC microammeter and a test switch, the actuation of which causes the meter to be connected to the probes, as required. Protective means are included for isolating the microammeter from the full AC power line voltage and an indicator is provided to show when the test switch may and may not be actuated. Means are also provided to protect the microammeter in the event that the test switch is inadvertently actuated when it should not be.

In operation, the load apparatus is plugged into the outer end of a circuit being traced. As the point of origination of this circuit, which may be a panel board with a multitude of circuit protective devices such as circuit breakers and/or fuses, one test probe of the test circuit is connected directly to one of the phase bars of the power distribution panel. The other test lead of the test circuit is then touched sequentially to the load side of each of the circuit protective devices of the distribution panel. If the latter probe contacts another phase bar or the neutral bus, the protective means prevents coupling of the microammeter to the probes, while the indicator shows that the test switch should not be actuated. When the indicator shows that the test switch should be actuated, the microammeter is connected across the circuit protective device and senses the small DC voltage drop across its contact resistance. If zero, the probe is moved to the next circuit. A DC voltage when sensed identifies the circuit being sought.

DESCRIPTION OF THE DRAWINGS

The invention will be more fully understood from the following detailed description taken in conjunction with the accompanying drawing, in which.

DETAILED DESCRIPTION OF THE INVENTION

It is understood that the terms "overcurrent protective device" or "circuit protective device" are intended to mans a mean breaker or fuse. For purposes of illustration, circuit breakers are shown in the embodiment described below.

Figure 1:
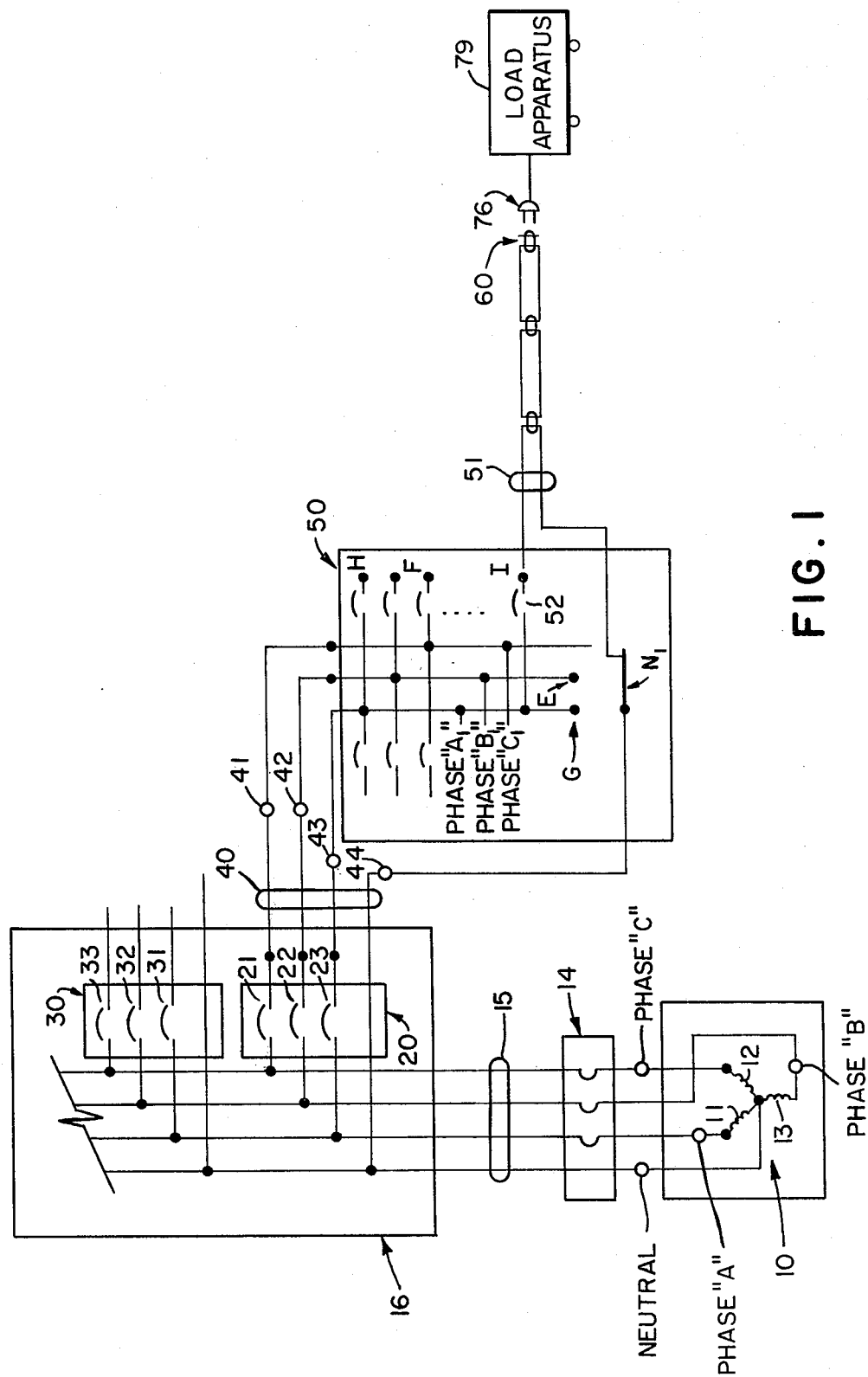
FIG. 1 is a schematic representation of a three phase AC power distribution network of a type with which the invention is useful.

Referring to FIG. 1 there is shown a generalized schematic diagram of a typical three phase AC power distribution network, which includes a three phase power source 10 having output windings 11, 12 and 13 connected in a three phase 4-wire configuration. The end of the windings typically designated as phases A, B and C, together with the neutral are connected to a main three phase circuit protective device 14. A three phase 4-wire feeder 15 is connected between protective device 14 and main switchboard 16. This switchboard may include 3-pole, 2-pole or 1-pole overcurrent protective devices. In the illustrated embodiment of FIG. 1, two 3-pole overcurrent protective devices 20 and 30 are shown, with device 20 having poles 21, 22 and 23, and device 30 having poles 31, 32 and 33. A three phase 4-wire feeder 40 is connected from device 20 to a distribution panelboard 50. The feeder 40 includes conductors 41, 42 and 43 which are respectively connected between poles 21, 22 and 23 of device 20 and phase buses $C_1$, $B_1$ and $A_1$ of panelboard 50. The neutral conductor 44 is connected to the neutral line $N_1$ of panelboard 50.

A feeder can also be connected between overcurrent protective device 30 and an associated panelboard as can additional feeder circuits. A multiplicity of branch circuits can be taken from each of the three phases of panelboard 50, as well as from other panelboards of an overall distribution network, and each of these branches is in turn provided with suitable overcurrent protective devices within respective panelboards. Each of the single phase circuits extending from the panelboard may be adapted to furnish electrical power for lighting, machinery, wall outlets and the like. In the illustrated embodiment, a branch circuit 51 is shown emanating from panelboard 50 having a first conductor connected to neutral line $N_1$ and a second conductor connected to an overcurrent protective device 52 which in turn is coupled to phase bus $A_1$. Branch circuit 51 includes one or more outlets 60 by which power can be applied to utilization apparatus.

An noted hereinabove, in industrial and commercial installations wiring is frequently added to existing installations, often without final and exact circuit diagrams, the result being that at the useful or load end of a circuit it is not known what other wiring and loads may be connected to the same branch, nor for that matter, is it known which overcurrent protective device in a switchboard serves the particular panelboard. As a feature of the present invention, if it becomes necessary to trace and identify branch circuits within a power distribution network, such as that illustrated in FIG. 1, the network can remain fully energized with all loads functioning normally during all of the steps required to identify a particular circuit and feeder.

For purposes of illustration it will be assumed that it is desired to trace and determine the point of origin in panelboard 50 of a branch circuit 51 which terminates at its output end in outlet 60. This branch circuit 51 is protected at the panelboard by overcurrent protective device 52 and is fed by bus $A_1$ and neutral $N_1$ which are, in turn, fed from main feeder 43 and neutral 44 respectively. In an operating installation there would usually be many other branch circuits extending from each of the buses, all of which may serve operating AC loads. It is assumed here that the connection of outlet 60 through overcurrent protective device 52 to pole 23 of overcurrent protective device 20 is unknown and is to be traced.

According to the invention, load apparatus is provided for coupling to a power outlet of any one of the branch circuits and this apparatus is operative to create a DC current flow in the associated circuit. The load apparatus is shown in typical embodiment in FIG. 2 and includes an overcurrent protective device 70 connected to a double pole, double throw selector switch 71 which, in turn, is connected to a load resistance network 72 having resistors R1, R2, R3 and R4. The resistance network 72 is connected in series with a power rectifier such as a diode 73, this series combination being connected between a pair of leads 74 and 75 which terminate in plug 76 or any other suitable means adapted for coupling into the end of the circuit under test. A fan 77 is connected in parallel with leads 74 and 75 and is operated by the AC power from whatever circuit the load is connected to for purposes of cooling resistance network 72.

The selector switch 71 includes a HI and LO switch position and is connected as shown to resistance network 72 such that different loads can be provided for higher and lower capacity branch circuits. The case in which the load apparatus is contained has connected thereto a ground line 78 for appropriate grounding of the load apparatus. During operation with plug 76 connected to outlet 60 of the circuit being traced (FIG. 1), AC power is applied to the load apparatus which through half-wave rectification causes a DC current to flow in circuit 51. This DC current component will flow even if circuit 51 also carries an AC current for whatever appliances or other utilization apparatus (not load may be connected thereto.

Figure 2:
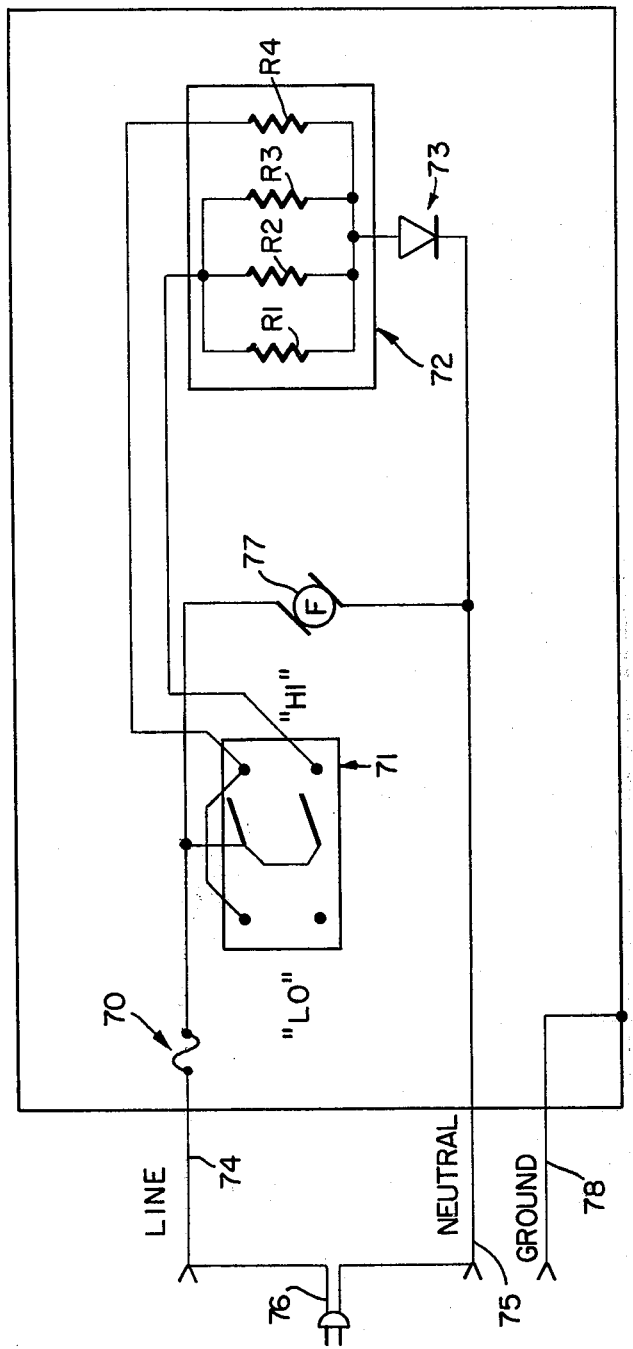
FIG. 2 is a schematic representation of load apparatus of the invention.
Figure 3:
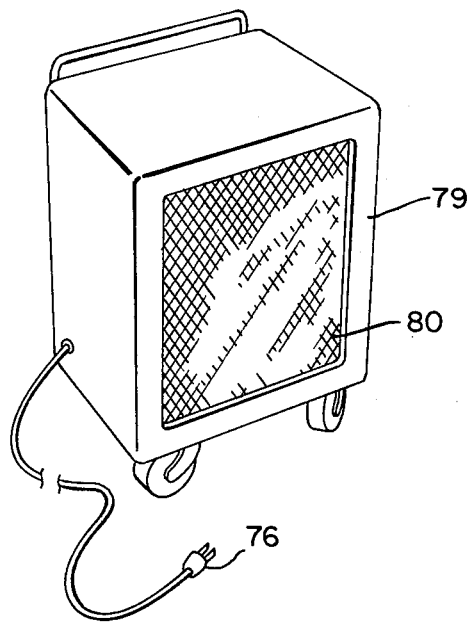
FIG. 3 is a pictorial view of a housing for the load apparatus of FIG. 2.

The components of the load apparatus shown in FIG. 2 are preferably housed within a portable cabinet 79 such as shown in FIG. 3. The cabinet may be formed with one or more open grills 80 in the side walls to facilitate ventilation and cooling by fan 77. The cabinet 79 is mounted on casters for ease of mobility.

Figure 4:
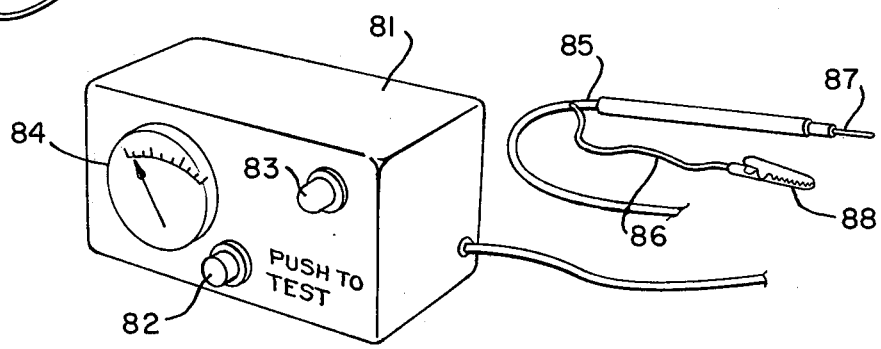
FIG. 4 is a pictorial view of the test box of the invention.

A test instrument 81 is shown in FIG. 4 and is used at the point of origin of the circuit under test. Externally the test instrument includes a test switch button 82, an indicator light 83, a center pointer microammeter 84, and a pair of electrical leads 85 and 86 which are respectively connected to an insulated handle test probe 87 and an alligator clip 88. The alligator clip 88 is adapted to be connected to one of the phase bars of the distribution network within the panelboard 50 (FIG. 1), while the test probe 87 is adapted to be touched to the load side of each of the overcurrent protective devices of the circuits one of which is to be ascertained or identified.

Figure 5:
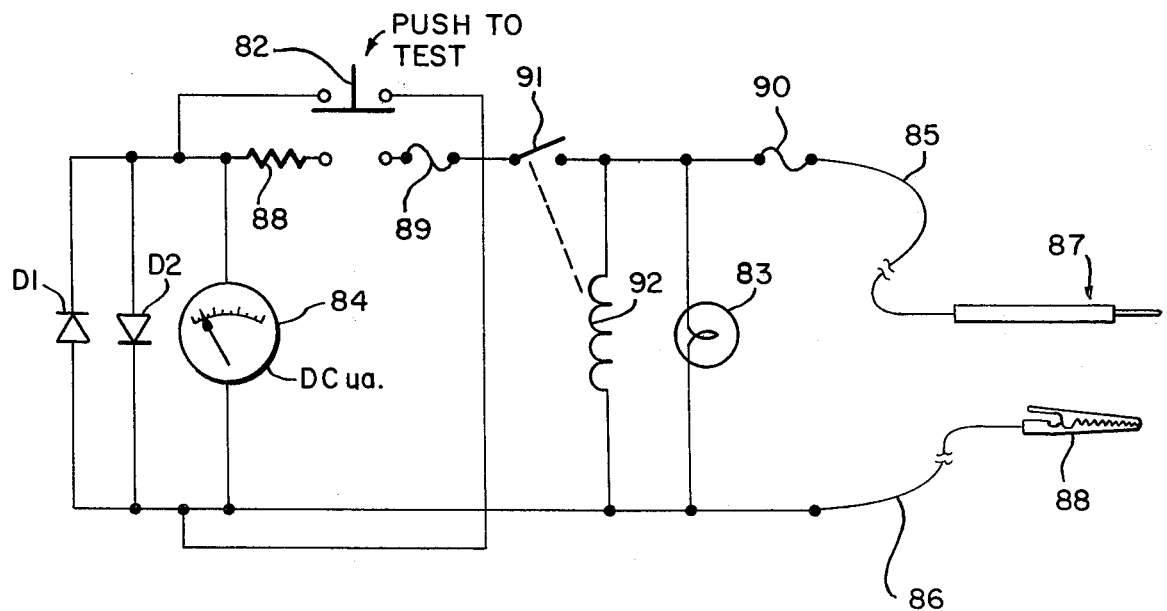
FIG. 5 is a schematic representation of the test circuitry of the invention.

A schematic circuit of the test instrument is shown in FIG. 5. The center position sensitive microammeter 84 has one terminal connected through current limiting resistor 88, the normally open test switch 82, protective fuses 89 and 90 and through normally closed relay contact 91 of relay 92 to test probe 87. The opposite terminal of the microammeter is connected to alligator clip 88. Relay 92 and indicator light 83 are each connected across the line through fuse 90. A pair of oppositely poled diodes D1 and D2 are shunted across microammeter 84 for over-voltage protection of the latter. The normally closed pole of test switch 82 is shunt connected to the terminals of microammeter 84.

To illustrate typical circuit tracing operation utilizing this invention, the plug 76 of the load apparatus illustrated in FIGS. 2 and 3 is plugged into outlet 60 of the branch circuit being traced in FIG. 1. The series combination of resistor network 72 and rectifier 73 draws DC current through overcurrent protective device 52 and additionally through pole 23 of overcurrent protective device 20. The individual performing the test now utilizes the test instrument shown in FIGS. 4 and 5 at the panelboard 50 in the following manner. The alligator clip 88 is connected to one of the phase bars within the distribution panel, $A_1$, $B_1$ or $C_1$, and the probe 87 is then touched to the load side of each of the protective devices within the panelboard in sequence. Let us assume that the alligator clip is attached first to phase bar $B_1$ at the point arbitrarily designated as E in FIG. 1 and that the probe is first touched to the point arbitrarily designated as F. In tracing the circuit between E and F it will be observed that the test probes 87 and 88 are directly across the full AC line voltage and as a consequence, referring back to FIG. 5, it will be seen that the indicator light 83 will turn on, indicating that the Push-to-Test button 82 should not be actuated and that the test must proceed further. It should be observed however that relay 92 is actuated and the normally closed contact 91 is open thus protecting microammeter 84 even if the Push-to-Test button 82 is inadvertently depressed.

Assume now that with the alligator clip 88 attached to Point G the probe 87 is touched to point H. Clearly the AC voltage drop between G and H is insignificant and relay 92 will not be energized and the indicator light 83 will not go on. At this point, the operator will actuate the Push-to-Test button 82 and the DC microammeter 84 will be connected directly between points G and H. Since there is no DC flow in the circuit which includes point H the microammeter 84 will remain at zero.

Finally, assume that with the alligator clip at point G the probe is touched to point I. Again, there is not AC voltage of significance between these two points. The relay 92 will not be actuated, and with light 83 off, the operator will push button 82. With DC flowing through overcurrent protective device 52 the finite though small electrical resistance of the various contacts involved will provide a small DC voltage drop between points G and I which will cause the microammeter 84 to deflect, the direction obviously being dependent upon the direction of the direct current flow. However, a deflection in either direction indicates that the probe is touching the load side of the only circuit within the panelboard 50 which carries the DC current. Branch circuit 52 is thus uniquely identified at the panel.

If alligator clip 88 has been connected initially to either of phase bars $B_1$ or $C_1$, then no DC signal would have been provided even if the probe 87 had been touched to the load side of each one of the circuit protective devices in those phases. The test procedure just outlined can be performed rapidly since the the probe 87 may be sequentially touched just momentarily to each of the appropriate points in rapid fashion once 23 alligator clip 88 is connected to a phase bar.

It should also be noted that the DC current flowing in branch circuit 51 also flows solely through pole 53 of overcurrent protective device 20 of main switchboard 16. Thus, the test which was described as being performed in panelboard 50 may likewise be performed in main switchboard 16. The microammeter 84 will sense a DC drop solely across pole 23 of device 20 and in this manner, the main feeder which energizes panelboard 50 is also indentified.

It will be understood that the DC voltage drops being sensed by microammeter 84 are exceedingly small due to the correspondingly small electrical resistance of the contacts of the overcurrent protective devices in large power distribution systems. On the other hand, this voltage drop is measurable and in a typical example, with a load 72 which draws 10 amperes, the DC voltage drop will be of the order of 500 microvolts across the contacts of a large circuit breaker and as much as 15 millivolts across a small circuit breaker. The relay 92 of course is completely insensitive to DC voltages of these small values but may be selected to operate universally on all of the AC line voltages normally encountered in such distribution systems.

In addition to the above procedure, the device will operate with equal success on a three phase 3-wire distribution system by connecting the test load to two phase legs of any three phase circuit or single phase circuit to identify the same.

In summary, it should be noted that branch circuit after branch circuit in the distribution system may be traced as above without in any way disrupting normal AC power usage. The load system shown in FIGS. 2 and 3 represents a convenient means for introducing a DC current in the circuit being traced but other arrangements are possible and will operate with equal efficiency.

Accordingly, it is intended that the present invention be limited and defined solely by the scope of the appended claims.

What is claimed is:

1. For use in an AC power distribution network having a plurality of live AC circuits each including a circuit protective device, a system for identifying a particular one of said plurality of live circuits and comprising:
   load means adapted to be coupled to said particular one of said plurality of live circuits for introducing a DC current in said circuit; and
   test means adapted to be coupled across the circuit protective device of each of said plurality of live circuits for detecting said DC current in said particular one of said circuits thereby to indentify said particular circuit.

2. The system according to claim 1 wherein said load means includes:
   means for rectifying an AC current received from said particular one of said plurality of circuits thereby to introduce said DC current in said circuit.

3. The system according to claim 1 wherein said load means includes:
   a load resistor; and
   a rectifier in circuit with said load resistor and operative to provide said DC current for introduction to said particular circuit.

4. The system according to claim 3 wherein said load means further includes means for cooling said load resistor and rectifier to maintain a predetermined operating temperature.

5. The system according to claim 1 wherein said test means includes:
   A DC meter means normally isolated from said live circuits;

indicator means operative to provide an output indication of coupling of said test means to other than said particular circuit;

means for coupling said meter means to one of said live circuits in the absence of said output indication;

said meter means indicating a DC circuit flow only when said test means is coupled to said particular circuit.

6. The system according to claim 1 wherein said test means includes:

a DC ammeter;

relay means including a relay coil in shunt with said ammeter and a pair of relay contacts serially connected between said relay coil and said ammeter;

an indicator light connected in shunt with said relay coil; and first and second test leads each connected to a respective end of said relay coil and adapted to be coupled to each of said circuit protective devices.

7. The system according to claim 1 wherein said test means includes:

meter means;

means normally isolating said meter means from said live circuits;

indicator means operative to provide an output indication of coupling of said test means to other than said particular circuit; and operating control means actuated in the absence of an output indication from said indicator means to couple said meter means to one of said live circuits;

said meter means indicating a DC current flow only when said test means is coupled to said particular circuit.

8. The system according to claim 1 wherein said test means includes:

a DC meter;

relay means including a relay coil in shunt with said meter and a pair of normally open relay contacts;

an indicator connected across said relay coil; and first and second test leads each connected to a respective end of said relay coil and adapted to be connected across each of said circuit protective devices.

9. The system according to claim 8 wherein said relay means further includes a pair of normally closed relay contacts series connected between one end of said relay coil and one terminal of said meter.

10. The system according to claim 9 further including first and second oppositely poled diodes connected in shunt with said meter, at least one being operative to conduct in the presence of a predetermined current magnitude thereby to prevent excessive current flow through said meter.

11. The system according to claim 10 wherein said load means includes:

a pair of leads for coupling to said particular one of said plurality of live circuits;

load resistor means and a rectifier series interconnected across said pair of leads; and a cooling fan connected across said leads for cooling of said load resistor means and rectifier during coupling of said leads to said particular circuit.

12. For use in the identification of one of a plurality of live AC circuits each having a circuit protective device, the method comprising:

introducing a predetermined DC current into a selected one of said live AC circuits; and identifying the selected one of said live AC circuits by sensing the presence of a DC voltage drop across said circuit protective device of said selected circuit.

13. For use in an AC power distribution network having plurality of live AC circuits each including a circuit protective device, a method for identifying a particular one of said plurality of live circuits comprising the steps of:

coupling a load means to said particular one of said plurality of live circuits for introducing a DC current in said circuit; and coupling a test means across the circuit protective device of each of said plurality of live circuits to detect said DC current flowing through a particular one of said circuit protective devices and thereby to identify the particular one of said circuits associated therewith.

14. For use in an AC power distribution network having a plurality of live AC circuits each including a circuit protective device, a method for identifying a particular one of said plurality of live circuits comprising the steps of:

coupling a load means to said particular one of said plurality of live circuits for introducing a DC current in said circuit;

coupling a test means across the circuit protective device of each of said plurality of live circuits in a sequential manner;

providing an output indication of coupling of said test means across a live circuit;

detecting, with respect to each circuit protective device across which the test means is coupled, the presence or absence of a DC current flow therein in the absence of said output indication;

identifying said particular circuit by the presence of DC current flow through a circuit protective device of that circuit.

15. For use in an AC power distribution network having a plurality of live AC circuits each including a circuit protective device, a method for identifying a particular one of said plurality of live circuits comprising the steps of:

introducing a DC current into a particular one of said plurality of live circuits;

sequentially coupling a test means to the circuit protective devices of said plurality of live circuits, which test means performs the steps of:

providing an output indication of the coupling of said test means across a live circuits; and coupling in the absence of said output indication a DC meter to the then coupled one of said circuit protective means;

the detection of a DC current flow therein thereby serving to identify said particular circuit.

* * * * *